(12) United States Patent
Yamaguchi et al.

(10) Patent No.: US 9,905,449 B2
(45) Date of Patent: *Feb. 27, 2018

(54) ELECTROSTATIC CHUCK

(71) Applicant: TOTO LTD., Kitakyushu-Shi, Fukuoka (JP)

(72) Inventors: Kosuke Yamaguchi, Fukuoka-Ken (JP); Kazuki Anada, Fukuoka-Ken (JP); Tatsuya Koga, Fukuoka-Ken (JP); Hiroki Matsui, Fukuoka-Ken (JP)

(73) Assignee: Toto Ltd., Fukuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,330

(22) Filed: Mar. 7, 2017

(65) Prior Publication Data

US 2017/0178944 A1    Jun. 22, 2017

Related U.S. Application Data

(63) Continuation of application No. 14/663,526, filed on Mar. 20, 2015, now Pat. No. 9,627,240.

(30) Foreign Application Priority Data

Mar. 27, 2014 (JP) .................. 2014-066667
Dec. 25, 2014 (JP) .................. 2014-262592

(51) Int. Cl.
*H01L 21/683* (2006.01)
*H02N 13/00* (2006.01)
*H01L 21/687* (2006.01)

(52) U.S. Cl.
CPC ...... *H01L 21/6833* (2013.01); *H01L 21/6831* (2013.01); *H01L 21/68757* (2013.01); *H02N 13/00* (2013.01); *H01L 2221/683* (2013.01); *Y10T 279/33* (2015.01)

(58) Field of Classification Search
CPC ............ H01L 21/6831; H01L 21/6833; H01L 21/68757; H01L 2221/683; H02N 13/00; Y10T 279/23

See application file for complete search history.

(56) References Cited

U.S. PATENT DOCUMENTS 7,651,571 B2    1/2010   Migita
8,358,493 B2    1/2013   Kugimoto et al.
8,505,928 B2    8/2013   Saito et al.
(Continued)

FOREIGN PATENT DOCUMENTS

JP          2011-082405 A          4/2011

*Primary Examiner* — Eric A Gates
(74) *Attorney, Agent, or Firm* — Carrier Blackman & Associates, P.C.; Joseph P. Carrier; William D. Blackman

(57) ABSTRACT

An electrostatic chuck includes: a ceramic dielectric substrate having a first major surface, a second major surface, and a through-hole; a metallic base plate which has a gas introduction path that communicates with the through-hole; and a bonding layer which is provided between the ceramic dielectric substrate and the base plate and includes a resin material. The bonding layer has a space which is provided between an opening of the through-hole in the second major surface and the gas introduction path and is larger than the opening in a horizontal direction, and a first area in which an end face of the bonding layer on a side of the space intersects with the second major surface being recessed from the opening further than a second area of the end face which is different from the first area.

19 Claims, 10 Drawing Sheets

(56) References Cited

U.S. PATENT DOCUMENTS

| | | |
|---|---|---|
| 9,105,676 B2 | 8/2015 | Shih et al. |
| 9,275,887 B2 | 3/2016 | Matyushkin et al. |
| 9,370,920 B2 | 6/2016 | Eto et al. |
| 2011/0024049 A1 | 2/2011 | Stevenson et al. |
| 2013/0201597 A1 | 8/2013 | Ishikawa et al. |
| 2013/0286531 A1 | 10/2013 | Shiraiwa et al. |
| 2013/0308244 A1 | 11/2013 | Shiraiwa et al. |
| 2013/0340942 A1 | 12/2013 | Schaefer et al. |
| 2014/0159325 A1 | 6/2014 | Parkhe et al. |
| 2014/0356985 A1 | 12/2014 | Ricci et al. |
| 2015/0129134 A1 | 5/2015 | Matsumoto et al. |
| 2016/0035610 A1 | 2/2016 | Park et al. |
| 2016/0343600 A1 | 11/2016 | Parkhe |

ELECTROSTATIC CHUCK

CROSS-REFERENCE TO RELATED APPLICATIONS

This application is a continuation of U.S. patent application Ser. No. 14/663,526, filed Mar. 20, 2015, which is based upon and claims the benefit of priorities from Japanese Patent Application No. 2014-066667, filed on Mar. 27, 2014 and Japanese Patent Application No. 2014-262592, filed on Dec. 25, 2014. The entire contents of these prior applications are incorporated herein by reference.

FIELD

Embodiments of the invention relate generally to an electrostatic chuck.

BACKGROUND

In a substrate treatment apparatus for performing etching, chemical vapor deposition (CVD), sputtering, ion implantation, ashing, exposure, inspection, or the like, as means for adsorbing and holding an object to be adsorbed (a treatment object) such as a semiconductor wafer or a glass substrate, an electrostatic chuck is used.

The electrostatic chuck is fabricated by inserting an electrode in a ceramic dielectric substrate such as alumina and performing firing. The electrostatic chuck is for applying power for electrostatic adsorption to the built-in electrode, thereby adsorbing a substrate such as a silicon wafer by an electrostatic force.

In such a substrate treatment apparatus, for higher throughput, an increase in output of a plasma process and an increase in temperature of the plasma process are progressing. For the higher throughput, a cooling function of the object to be adsorbed is one of the main points. Further, realizing the higher throughput leads to an increase in the amount of heat which is input to the substrate treatment apparatus. For this reason, a material of a member which can be used in the electrostatic chuck is limited to a highly thermally-resistant material.

For example, for an adhesive to bond a ceramic dielectric substrate to a metal plate which supports the ceramic dielectric substrate, bonding strength between ceramic and metal at a high temperature, heat transference from the ceramic to the metal, flexibility capable of coping with shear stress due to a difference in thermal expansion, electrical insulation properties, and the like are required. While there is an adhesive having relatively high thermal conductivity or an adhesive having relatively excellent heat resistance and plasma resistance, as compared to ceramic, metal, or the like, the plasma resistance of the adhesive in the plasma process is the lowest among members which are used for the electrostatic chuck. For this reason, the life of the adhesive becomes the life of the electrostatic chuck.

If the adhesive is damaged in a process such as etching, a ceramic filler component which improves heat conduction or an elastomer component which cannot be gasified sometimes becomes a particle source. Further, if the adhesive is damaged, the thermal conductivity of the adhesive is reduced, and thus a function of heat conduction and a function of uniformly maintaining the temperature of the object to be adsorbed are not sometimes fulfilled. Therefore, an electrostatic chuck is desired in which it is possible to reduce damage to which the adhesive is subjected.

SUMMARY

According to an aspect of the invention, there is provided an electrostatic chuck including: a ceramic dielectric substrate having a first major surface on which an object to be adsorbed is placed, a second major surface on an opposite side to the first major surface, and a through-hole provided over from the second major surface to the first major surface; a metallic base plate which supports the ceramic dielectric substrate and has a gas introduction path that communicates with the through-hole; and a bonding layer which is provided between the ceramic dielectric substrate and the base plate and includes a resin material, the bonding layer having a space which is provided between an opening of the through-hole in the second major surface and the gas introduction path and is larger than the opening in a horizontal direction, and a first area in which an end face of the bonding layer on a side of the space intersects with the second major surface being recessed from the opening further than another second area of the end face which is different from the first area.

DETAILED DESCRIPTION

Figure 1:
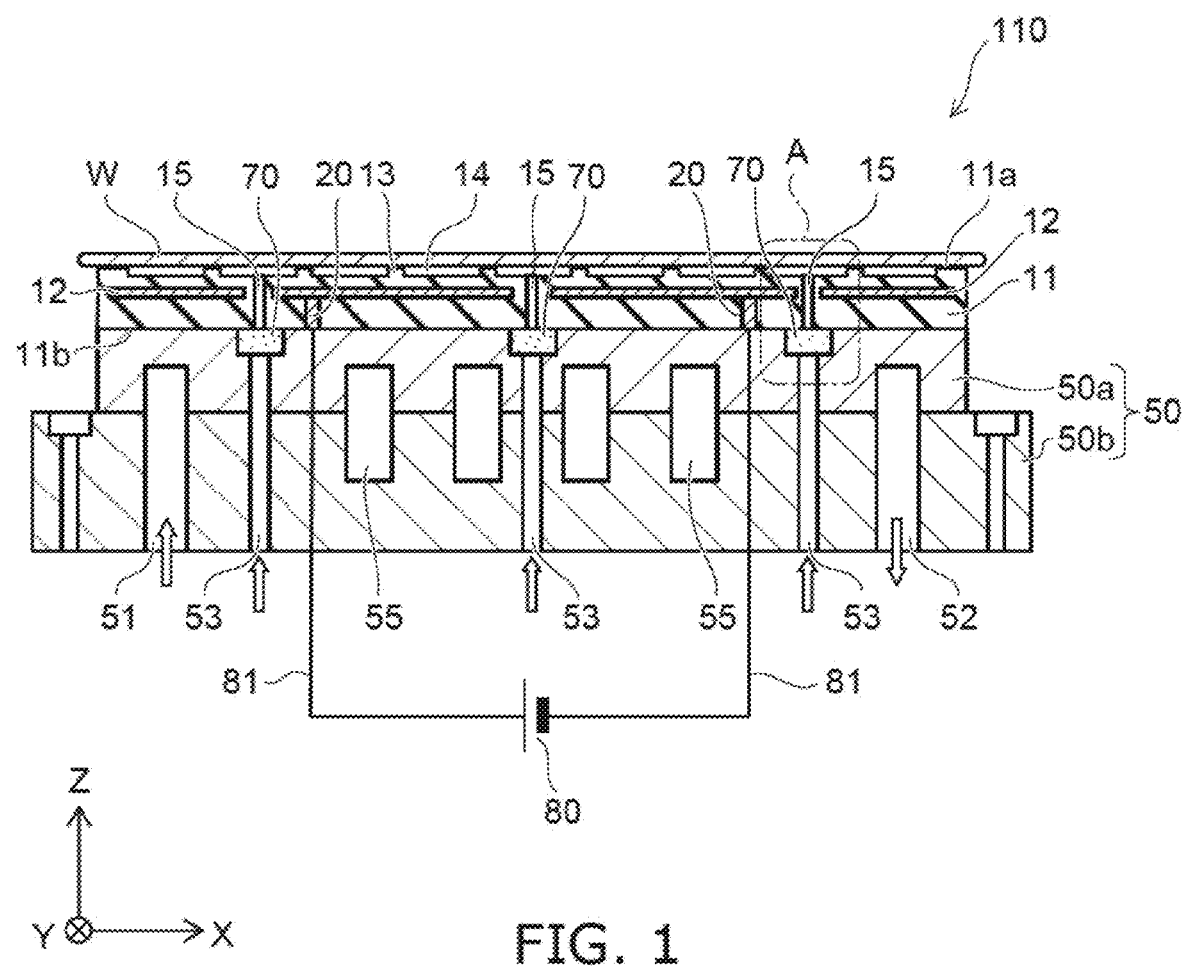
FIG. 1 is a schematic cross-sectional view illustrating the configuration of an electrostatic chuck according to the embodiment.

According to a first invention, there is provided an electrostatic chuck including: a ceramic dielectric substrate having a first major surface on which an object to be adsorbed is placed, a second major surface on an opposite side to the first major surface, and a through-hole provided over from the second major surface to the first major surface; a metallic base plate which supports the ceramic dielectric substrate and has a gas introduction path that communicates with the through-hole; and a bonding layer which is provided between the ceramic dielectric substrate and the base plate and includes a resin material, the bonding layer having a space which is provided between an opening of the through-hole in the second major surface and the gas introduction path and is larger than the opening in a horizontal direction, and a first area in which an end face of the bonding layer on a side of the space intersects with the second major surface being recessed from the opening further than another second area of the end face which is different from the first area.

According to the electrostatic chuck, regardless of the durability of an adhesive itself, it is possible to reduce damage to which the bonding layer is subjected. Even if the bonding layer is damaged, it is possible to reduce the scattering of particles.

According to a second invention, in the electrostatic chuck according to the first invention, in the first area when viewed in a direction perpendicular to a normal to the second major surface, an angle between the second major surface and the end face becomes larger toward the second major surface.

According to the electrostatic chuck, regardless of the durability of an adhesive itself, it is possible to reduce damage to which the bonding layer is subjected. Even if the bonding layer is damaged, it is possible to reduce the scattering of particles.

According to a third invention, in the electrostatic chuck according to the second invention, a third area in which an angle between the second major surface and the end face becomes smaller with distance from the second major surface in a direction of the normal is provided.

According to the electrostatic chuck, regardless of the durability of an adhesive itself, it is possible to reduce damage to which the bonding layer is subjected. Even if the bonding layer is damaged, it is possible to reduce the scattering of particles.

According to a fourth invention, in the electrostatic chuck according to the first invention, a distance between the end faces facing each other becomes shorter with distance from the second major surface in a direction of the normal.

According to the electrostatic chuck, regardless of the durability of an adhesive itself, it is possible to reduce damage to which the bonding layer is subjected. Even if the bonding layer is damaged, it is possible to reduce the scattering of particles.

According to a fifth invention, in the electrostatic chuck according to the first invention, in a distance d between the end face in the first area and a center of the through-hole and a distance D between the end faces facing each other in the second area, a relational expression of $2d \geq D$ is established.

In a case where a cross-sectional structure of the end face is asymmetric, the distance d is set to be a distance of the maximum value among the distances between the end face in the first area and the center of the through-hole. According to the electrostatic chuck, it is possible to form a pocket in which particles can be deposited.

According to a sixth invention, in the electrostatic chuck according to the fifth invention, the distance d is 0.1 millimeters or more and 5.0 millimeters or less.

According to the electrostatic chuck, it is possible to attain both a reduction in the amount of damage to which an adhesive is subjected and uniform temperature distribution of the object.

According to a seventh invention, in the electrostatic chuck according to the first invention, the bonding layer has a bonding portion which bonds the second major surface and the base plate together, and an end portion which has the end face and forms the space, and a material of the bonding portion is different from a material of the end portion.

According to the electrostatic chuck, the end portion is made so as not to contain fillers improving thermal conductivity, and thus it is possible to reduce occurrence of particles. Further, in a case where a silicone adhesive is used as the bonding portion, a material having more excellent plasma resistance than the silicone adhesive can be used for the end portion.

According to an eighth invention, in the electrostatic chuck according to the first invention, the bonding layer has a bonding portion which bonds the second major surface and the base plate together, and an end portion which has the end face and forms the space, and a material of the bonding portion is the same as a material of the end portion.

According to the electrostatic chuck, it is possible to further enhance an adhesive force between the bonding portion and the end portion.

According to a ninth invention, in the electrostatic chuck according to the seventh invention, thermal conductivity of an adhesive which is used in the bonding portion is 0.1 watts/meter·kelvin or more, dielectric breakdown strength of an adhesive which is used in the bonding portion is 1 kilovolt/millimeter or more, and a heat resistance temperature of an adhesive which is used in the bonding portion is 40° C. or more.

According to the electrostatic chuck, it is possible to use an adhesive which can maintain insulation while maintaining good heat transfer even if the electrostatic chuck is used in a high-temperature process. Further, it is possible to have elasticity capable of alleviating a difference between the thermal expansion of the ceramic dielectric substrate and the thermal expansion of the base plate.

According to a tenth invention, in the electrostatic chuck according to the fifth invention, the electrostatic chuck further includes a porous body provided in the gas introduction path, wherein in the distance d and a radius R of the porous body, a relational expression of $d > R$ is established.

According to the electrostatic chuck, a pocket in which particles can be deposited is formed, and thus the convection of transfer gas can be created in the space such that particles are easily deposited in the pocket. That is, the convection of the transfer gas which selectively deposits particles in the pocket can be controlled in the space. For this reason, even if particles are generated, it is possible to reduce the scattering of the particles. Further, the porous body is provided, whereby it is possible to have high voltage resistance in the through-hole and the gas introduction path.

According to an eleventh invention, in the electrostatic chuck according to the fifth invention, the distance d is larger than a radius of an opening of the through-hole on a side of the first major surface.

According to the electrostatic chuck, regardless of the durability of an adhesive itself, it is possible to reduce damage to which the bonding layer is subjected. Even if the bonding layer is damaged, it is possible to reduce the scattering of particles.

According to a twelfth invention, in the electrostatic chuck according to the first invention, a length in the horizontal direction of the space is longer than a thickness of the bonding layer.

According to the electrostatic chuck, regardless of the durability of an adhesive itself, it is possible to reduce damage to which the bonding layer is subjected. Even if the bonding layer is damaged, it is possible to reduce the scattering of particles.

According to a thirteenth invention, in the electrostatic chuck according to the seventh invention, the end portion comes into contact with each of the second major surface and the base plate in a plane, and a length in the horizontal direction of the plane in which the end portion comes into contact with each of the second major surface and the base plate is longer than a thickness of the bonding layer.

According to the electrostatic chuck, unlike a case where, instead of the end portion, an O-ring is provided, the end portion of the bonding layer can contribute to the bonding between the ceramic dielectric substrate and the base plate.

According to a fourteenth invention, in the electrostatic chuck according to the thirteenth invention, an outer peripheral portion of the end portion, the outer peripheral portion being on an opposite side to the space when viewed from the end portion, is filled with the resin material.

According to the electrostatic chuck, unlike a case where, instead of the end portion, an O-ring is provided, it is possible to prevent occurrence of a space in the bonding layer. The end portion of the bonding layer can contribute to the bonding between the ceramic dielectric substrate and the base plate, and thus, it is possible to more solidly bond the ceramic dielectric substrate and the base plate to each other.

According to a fifteenth invention, in the electrostatic chuck according to the thirteenth invention, a plane in which the second major surface comes into contact with the end portion is on a same plane as a plane in which the second major surface is bonded by the bonding layer, and a plane in which the base plate comes into contact with the end portion is on a same plane as a plane in which the base plate is bonded by the bonding layer.

According to the electrostatic chuck, unlike a case where, instead of the end portion, an O-ring is provided, the end portion of the bonding layer can contribute to the bonding between the ceramic dielectric substrate and the base plate.

According to a sixteenth invention, in the electrostatic chuck according to the thirteenth invention, curvature of the end face in the first area is larger than curvature of the end face in the second area.

According to the electrostatic chuck, unlike a case where, instead of the end portion, an O-ring is provided, the end portion of the bonding layer can contribute to the bonding between the ceramic dielectric substrate and the base plate.

According to a seventeenth invention, in the electrostatic chuck according to the first invention, the ceramic dielectric substrate includes a Coulomb material having volume resistivity of $1 \times 10^{14}$ ohm·centimeter or more.

According to the electrostatic chuck, regardless of the durability of an adhesive itself, it is possible to reduce damage to which the bonding layer is subjected. Even if the bonding layer is damaged, it is possible to reduce the scattering of particles.

Hereinafter, an embodiment of the invention will be described with reference to the drawings. In addition, in each drawing, the same constituent elements are denoted by the same reference numerals and detailed description is appropriately omitted.

In addition, the drawings are schematic or conceptual, and the relationship between a thickness and a width of each portion, the ratio between the sizes of portions, and the like are not necessarily the same as those of reality. Further, even in a case of showing the same portion, there is also a case where the respective dimensions or ratios are shown differently according to the drawings.

FIG. 1 is a schematic cross-sectional view illustrating the configuration of an electrostatic chuck according to the embodiment.

Figure 2A:
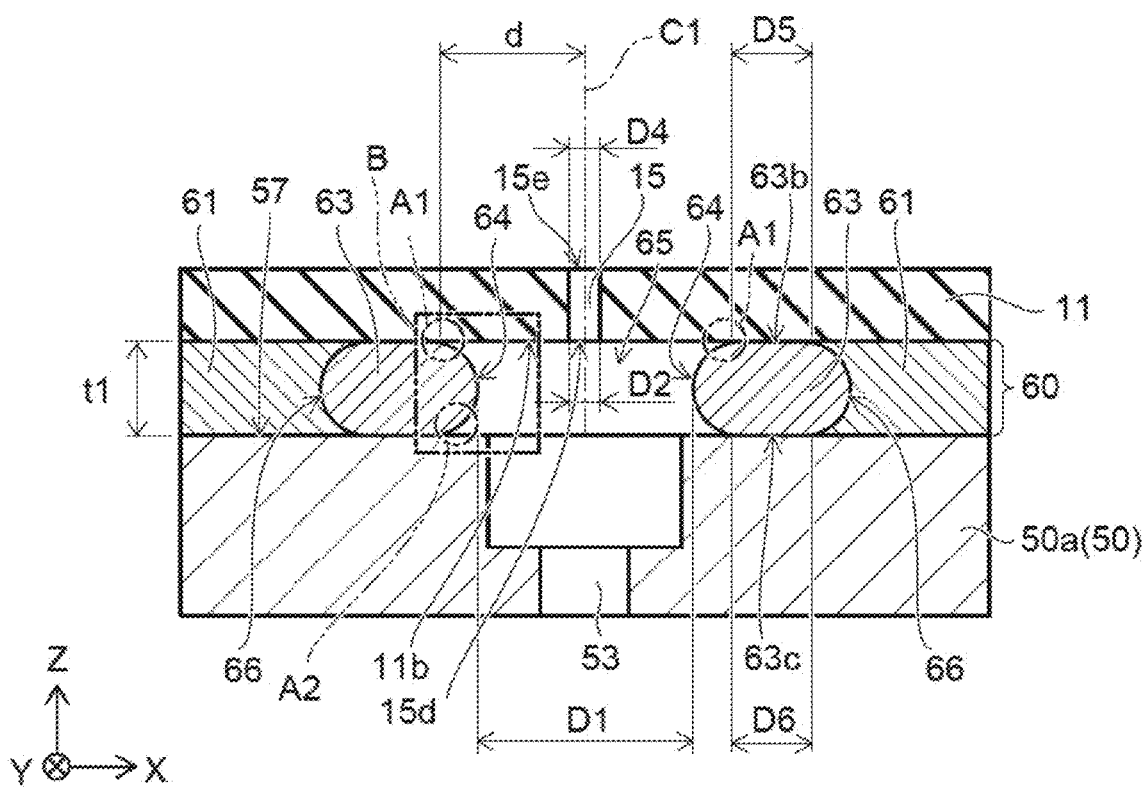
FIGS. 2A and 2B are schematic enlarged views showing the vicinity of a bonding layer of the embodiment.
Figure 2B:
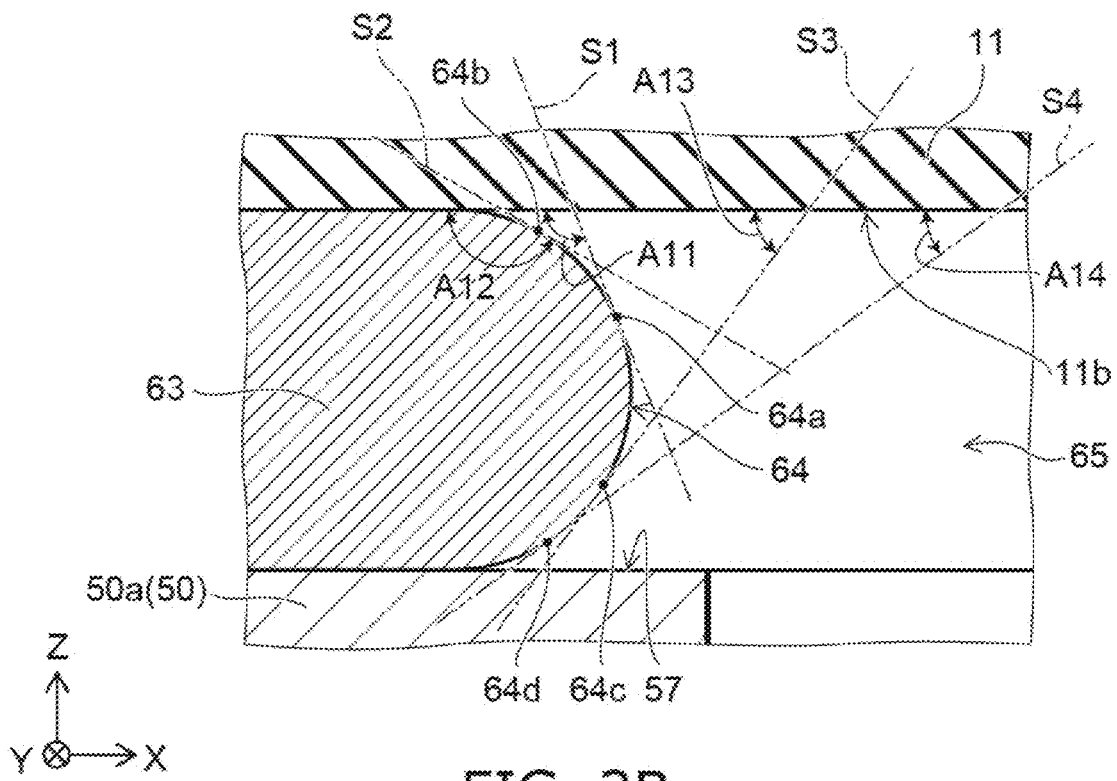

FIGS. 2A and 2B are schematic enlarged views showing the vicinity of a bonding layer of the embodiment.

Figure 3:
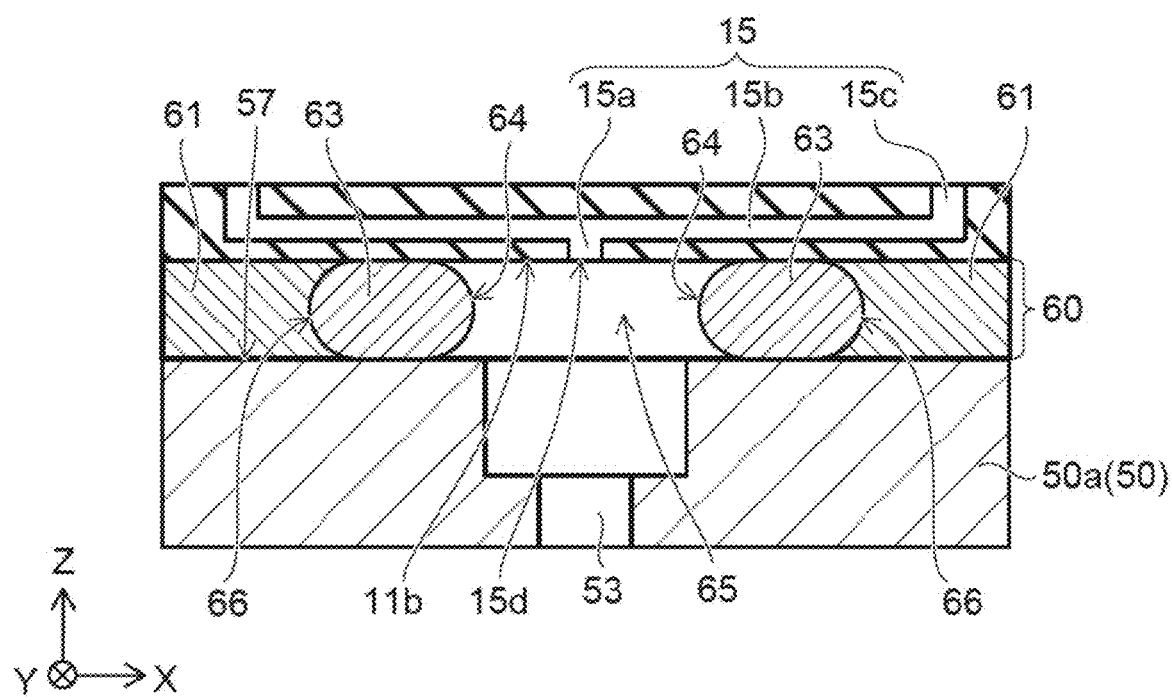
FIG. 3 is a schematic enlarged cross-sectional view of a variation of a portion A shown in FIG. 1.

FIG. 3 is a schematic enlarged cross-sectional view of a variation of a portion A shown in FIG. 1.

Figure 4A:
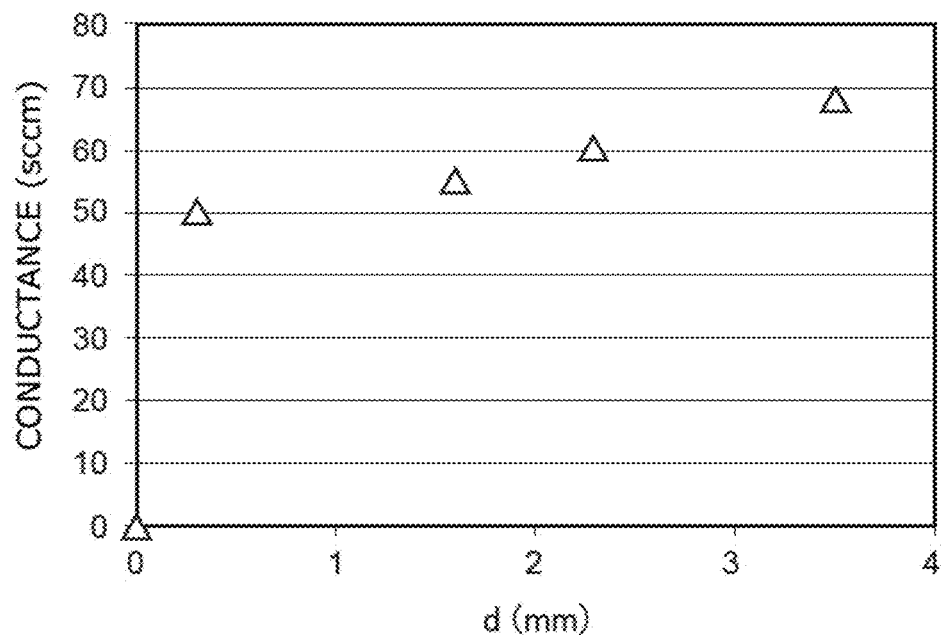
FIGS. 4A and 4B are graphs illustrating the relationship between a distance d and a temperature difference, and a graph illustrating the relationship between the distance d and conductance.
Figure 4B:
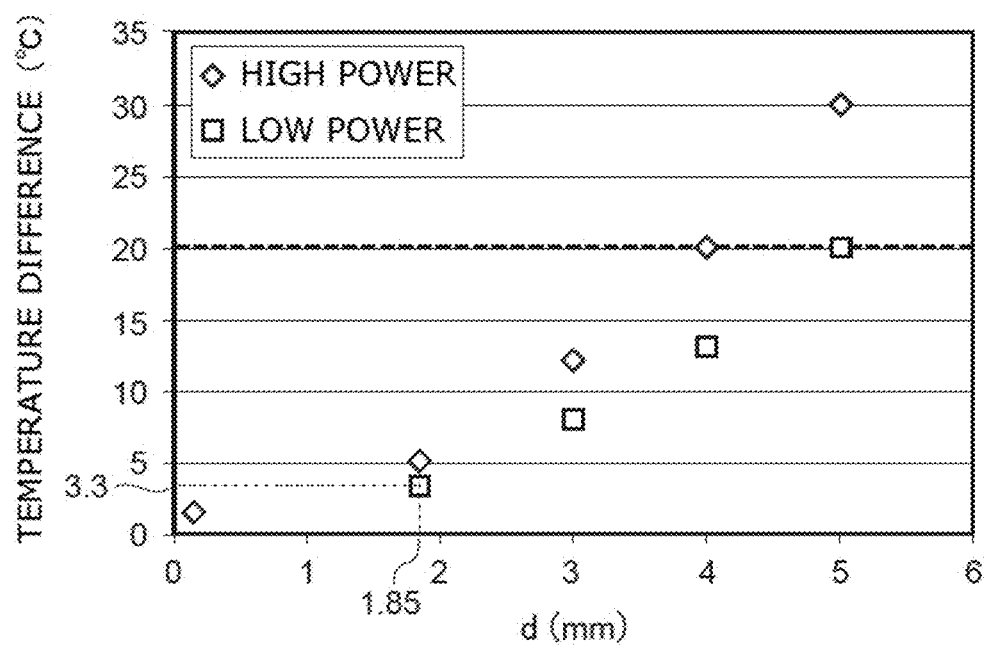

FIGS. 4A and 4B are a graph illustrating the relationship between a distance d and a temperature difference, and a graph illustrating the relationship between the distance d and conductance.

In addition, FIGS. 2A and 2B are schematic cross-sectional views in a cutting surface passing through the center of a gas introducing path of a base plate. The following schematic cross-sectional views are those in the cutting surface.

FIG. 2A is a schematic enlarged view of the portion A shown in FIG. 1. FIG. 2B is a schematic enlarged view of a portion B shown in FIG. 2A. For convenience of description, in FIG. 2A, an electrode 12 is omitted. The omission of the electrode 12 is the same in FIGS. 3, 5, and 6.

FIG. 4A is a graph illustrating the relationship between a distance d between an end face 64 in an area A1 shown in FIG. 2A and a center C1 of a through-hole 15 and the conductance of transfer gas. FIG. 4B is a graph illustrating the relationship between the distance d between the end face 64 in the area A1 shown in FIG. 2A and the center C1 of the through-hole 15 and a temperature difference in a plane of an object W. The horizontal axes of the graphs shown in FIGS. 4A and 4B show the distance d (mm) between the end face 64 in the area A1 and the center C1 of the through-hole 15. The vertical axis of the graph shown in FIG. 4A shows the conductance (sccm: standard cc/min) of the transfer gas. The vertical axis of the graph shown in FIG. 4B shows the temperature difference (° C.) in a plane of the object W.

As shown in FIGS. 1 and 2A, an electrostatic chuck 110 according to the embodiment is provided with a ceramic dielectric substrate 11, a base plate 50, and a bonding layer 60.

The ceramic dielectric substrate 11 is a flat plate-shaped base material made of, for example, sintered ceramic, and has a first major surface 11a on which the object W of adsorption such as a semiconductor substrate such as a silicon wafer is placed, and a second major surface 11b on the side opposite to the first major surface 11a.

In the ceramic dielectric substrate 11, the electrode 12 is provided. The electrode 12 is interposed between the first major surface 11a and the second major surface 11b of the ceramic dielectric substrate 11. That is, the electrode 12 is formed so as to be inserted into the ceramic dielectric substrate 11. The electrostatic chuck 110 generates electric charge on the first major surface 11a side of the electrode 12 by applying voltage for adsorption holding 80 to the electrode 12 and adsorbs and holds the object W by an electrostatic force.

Here, in the description of the embodiment, a direction (a first direction) connecting the first major surface 11a and the second major surface 11b shall be referred to as a Z-direction, one (a second direction) of directions orthogonal to the Z-direction shall be referred to as a Y-direction, and a direction (a third direction) orthogonal to the Z-direction and the Y-direction shall be referred to as an X-direction.

The electrode 12 is provided in the form of a thin film along the first major surface 11a and the second major surface 11b of the ceramic dielectric substrate 11. The electrode 12 is an adsorption electrode for adsorbing and holding the object W. The electrode 12 may be a unipolar type or may also be a bipolar type. The electrode 12 shown in FIG. 1 is a bipolar type, and the two-pole electrode 12 is provided on the same plane.

At the electrode 12, a connection portion 20 extending to the second major surface 11b side of the ceramic dielectric substrate 11 is provided. The connection portion 20 is made by connecting a via (a solid type), a via hole (a hollow type), or a metal terminal which is electrically connected to the electrode 12, by an appropriate method such as brazing.

The base plate 50 is a member which supports the ceramic dielectric substrate 11. The ceramic dielectric substrate 11 is fixed onto the base plate 50 through the bonding layer 60 shown in FIG. 2A. That is, the bonding layer 60 is provided between the ceramic dielectric substrate 11 and the base plate 50.

The bonding layer 60 has a bonding portion 61 and an end portion 63. The bonding portion 61 bonds the second major surface 11b of the ceramic dielectric substrate 11 and the base plate 50 together. The bonding layer 60 includes a resin material. The bonding layer 60 includes a polymer material which is, for example, a silicone-based, acrylic, modified silicone-based, or epoxy-based polymer material and contains at least one of carbon (C), hydrogen (H), nitrogen (N), silicon (Si), oxygen (O), and sulfur (S) as its main component. As for the bonding portion 61, for example, a silicone adhesive, a silicone-based heat conduction material having excellent electrical insulation properties, or the like is used. The end portion 63 has, for example, a ring-like shape. The details of the bonding layer 60 will be described later.

The base plate 50 is divided into an upper portion 50a and a lower portion 50b made of, for example, aluminum, and a communication path 55 is provided between the upper portion 50a and the lower portion 50b. The communication path 55 is connected, on the one end side, to an input path 51 and connected, on the other end side, to an output path 52.

The base plate 50 also plays a role of performing temperature adjustment of the electrostatic chuck 110. For example, in a case of cooling the electrostatic chuck 110, a cooling medium flows in from the input path 51, passes through the communication path 55, and then flows out from the output path 52. In this way, the heat of the base plate 50 is absorbed by the cooling medium, and thus the electrostatic chuck 110 mounted thereon is cooled. On the other hand, in a case of keeping the electrostatic chuck 110 warm, it is also possible to put a heat maintaining medium in the communication path 55. Or, it is also possible to make the electrostatic chuck 110 or the base plate 50 have a built-in heating element. In this manner, if the temperature of the electrostatic chuck 110 is adjusted through the base plate 50, it is possible to adjust the temperature of the object W which is adsorbed and held by the electrostatic chuck 110.

Further, on the first major surface 11a side of the ceramic dielectric substrate 11, projections 13 are provided as necessary, and a groove 14 is provided between the projections 13. The groove 14 is in communication with the outside, and thus a space is formed between the back surface of the object W placed on the electrostatic chuck 110 and the groove 14.

The through-hole 15 provided in the ceramic dielectric substrate 11 is connected to the groove 14. The through-hole 15 is provided to penetrate the ceramic dielectric substrate 11 over a range from the second major surface 11b to the first major surface 11a of the ceramic dielectric substrate 11. The through-holes 15 may be provided at a plurality of places in the ceramic dielectric substrate 11.

In addition, as shown in FIG. 3, the through-hole 15 may have a portion in which an axis of a hole extends in a horizontal direction (the X-direction). The through-hole 15 shown in FIG. 3 has a first hole portion 15a, a second hole portion 15b, and a third hole portion 15c. One end of the first hole portion 15a is connected to the second major surface 11b of the ceramic dielectric substrate 11. One end of the third hole portion 15c is connected to the groove 14. The second hole portion 15b is connected to the first hole portion 15a and the third hole portion 15c. More specifically, one end of the second hole portion 15b is connected to the other end of the first hole portion 15a. The other end of the second hole portion 15b is connected to the other end of the third hole portion 15c. In this manner, the through-hole 15 has a space physically connecting the first major surface 11a and the second major surface 11b and is not limited to a straight line-shaped hole. Further, the shape of the through-hole 15 may be, for example, a spherical shape or an arc shape and is not limited to a specific shape. In a case where a plurality of through-holes 15 are provided, if at least one of the plurality of through-holes 15 satisfies the conditions of the through-hole of the embodiment, the electrostatic chuck 110 according to the embodiment is included in the scope of the invention.

As a material of the ceramic dielectric substrate 11, for example, a Coulomb material is used. The volume resistivity of the Coulomb material is, for example, about $1 \times 10^{14}$ ohm·centimeter (Ω·cm) or more. In a case where the Coulomb material which is used for the ceramic dielectric substrate 11 has semipermeability with respect to infrared or visible light, it is possible to visually confirm an internal space from the surface of the ceramic dielectric substrate 11. For this reason, as shown in FIG. 3, in a case where the through-hole 15 has a portion (the second hole portion 15b) in which an axis of a hole extends in the horizontal direction (the X-direction), it is possible to confirm the position of the second hole portion 15b from the surface of the ceramic dielectric substrate 11, and thus it is possible to more easily perform processing.

By appropriately selecting the height of the projection 13 (the depth of the groove 14), the area ratio between the projection 13 and the groove 14, the shapes of the projection 13 and the groove 14, or the like, it is possible to control the temperature of the object W or particles which are stuck to the object W, to be in a favorable state.

On the other hand, in the base plate 50, a gas introduction path 53 is provided. The gas introduction path 53 is provided so as to, for example, penetrate the base plate 50. As shown in FIG. 1, in the gas introduction path 53, an insulator plug 70 may be provided. The details of the insulator plug 70 will be described later. The gas introduction path 53 may be provided to branch from the middle of another gas introduction path 53 to the ceramic dielectric substrate 11 side without penetrating the base plate 50. Further, gas introduction paths 53 may be provided at a plurality of places in the base plate 50.

The gas introduction path 53 communicates with the through-hole 15. If transfer gas such as helium (He) is introduced from the gas introduction path 53 in a state of adsorbing and holding the object W, the transfer gas flows into a space provided between the object W and the groove 14, and thus it becomes possible to directly cool the object W by the transfer gas.

As shown in FIG. 2A, a space 65 is present between the through-hole 15 and the gas introduction path 53. More specifically, the space 65 is present between an opening 15d of the through-hole 15 in the second major surface 11b and the gas introduction path 53. That is, the bonding layer 60 has the space 65. The space 65 is located at a central portion of the end portion 63 having, for example, a ring shape and extends in the horizontal direction (the X-direction). The space 65 is formed by the ring-shaped end portion 63. A dimension (a distance between the end portions 63 (or the end faces 64) facing each other) D1 in the X-direction of the space 65 is larger than an opening dimension D2 of the opening 15*d*.

When bonding the ceramic dielectric substrate 11 and the base plate 50 together, first, the end portion 63 fabricated in advance is installed on a surface 57 of the base plate 50 or the second major surface 11*b* of the ceramic dielectric substrate 11 such that the space 65 is present between the through-hole 15 and the gas introduction path 53. Subsequently, an adhesive (for example, a silicone adhesive) which becomes the bonding portion 61 after curing is applied while securing the space 65. Subsequently, the ceramic dielectric substrate 11 and the base plate 50 are fitted to each other with the end portion 63 and the applied adhesive interposed therebetween.

After the adhesive is cured (after the bonding layer 60 is formed), a thickness (a dimension in the Z-direction) t1 of the bonding layer 60 is, for example, about 100 micrometers (μm) or more and 1000 μm or less. More preferably, the thickness t1 of the bonding layer 60 is, for example, about 200 μm or more and 600 μm or less. In this case, the thickness (the dimension in the Z-direction) of the end portion 63 in a state of being fabricated in advance (a state before installation) is, for example, about 200 μm or more and 600 μm or less. That is, the end portion 63 is crushed in the Z-direction in a process of fitting the ceramic dielectric substrate 11 and the base plate 50 to each other. After the adhesive is cured, the thickness of the end portion 63 is the same as the thickness t1 of the bonding layer 60.

The thickness t1 of the bonding layer 60 is smaller than the dimension D1 in the X-direction of the space 65. That is, the length in the horizontal direction (the X-direction) of the space 65 is longer than the length in the vertical direction (the Z-direction) of the space 65. In other words, the length in the horizontal direction of the space 65 is longer than the thickness t1 of the bonding layer 60. The space 65 having a cross-sectional shape which is longer in the horizontal direction than the vertical direction is connected to the through-hole 15 having a cross-sectional shape which is longer in the vertical direction than the horizontal direction.

The end face 64 of the bonding layer 60 on the space 65 side intersects with or comes into contact with the second major surface 11*b* of the ceramic dielectric substrate 11. The area A1 (a first area) in which the end face 64 intersects with the second major surface 11*b* is away from or is recessed from the opening 15*d* of the through-hole 15, compared to another area (a second area) of the end face 64 which is different from the area A1.

More specifically, in the area A1 when viewed in a direction perpendicular to a normal to the second major surface 11*b*, the angle between the second major surface 11*b* and the end face 64 becomes larger toward the second major surface 11*b*.

Here, in the specification, the "angle between the second major surface 11*b* and the end face 64" shall refer to the angle between the second major surface 11*b* of the ceramic dielectric substrate 11 and a plane tangent to an arbitrary point on the end face 64, which is measured on a side of the end portion 63.

As shown in FIG. 2B, for example, an angle A12 between the second major surface 11*b* and a plane S2 tangent to a point 64*b* on the end face 64 is larger than an angle A11 between the second major surface 11*b* and a plane S1 tangent to a point 64*a* on the end face 64.

On the other hand, in an area A2 (a third area) in which the end face 64 intersects with or comes into contact with the surface 57 of the base plate 50, when viewed in a direction perpendicular to a normal to the second major surface 11*b*, the angle between the second major surface 11*b* and the end face 64 becomes smaller with distance from the second major surface 11*b* in a normal direction. As shown in FIG. 2B, for example, an angle A14 between the second major surface 11*b* and a plane S4 tangent to a point 64*d* on the end face 64 is smaller than an angle A13 between the second major surface 11*b* and a plane S3 tangent to a point 64*c* on the end face 64.

According to the embodiment, regardless of the durability of the adhesive, it is possible to reduce damage to which the bonding layer 60 is subjected. Even if the bonding layer 60 is damaged, it is possible to reduce the scattering of particles.

As shown in FIG. 2A, with respect to the distance d between the end face 64 in the area A1 and the center C1 of the through-hole 15 and the distance D1 between the end portions 63 (the distance between the end faces 64) facing each other in another area of the end face 64 which is different from the area A1, the following expression is established.

$$2d \geq D1 \quad \text{Expression (1)}$$

In the schematic cross-sectional view shown in FIG. 2A, in a case where a cross-sectional structure of the end face 64 is asymmetric, the distance d is set to be a distance of the maximum value among the distances between the end face 64 in the area A1 and the center C1 of the through-hole 15. Due to this, in the area A1, a pocket in which particles can be deposited is formed.

The diameter of the through-hole 15 (the opening dimension D2 of the opening 15*d*) affects the conductance of the transfer gas flowing through the through-hole 15 and a temperature difference in the object W which is adsorbed (a temperature difference between the position on the object W just above the through-hole 15 and the periphery thereof). For example, if the diameter (D2) of the through-hole 15 is small, the conductance is reduced, and thus the flow of the transfer gas sometimes becomes poor. In contrast, if the diameter (D2) of the through-hole 15 is larger, an area in which a temperature difference in the object W which is adsorbed is large (so-called hot spot or cold spot) is sometimes generated. According to the knowledge that the inventor(s) has obtained, it is favorable that the diameter (D2) of the through-hole 15 is, for example, 0.04 millimeters (mm) or more and 3 mm or less. It is more favorable that the diameter (D2) of the through-hole 15 is, for example, 0.07 mm or more and 2.5 mm or less. It is further favorable that the diameter (D2) of the through-hole 15 is, for example, 0.1 mm or more and 2 mm or less.

The longer the distance between plasma and the adhesive (the distance between the center C1 of the through-hole 15 and the end face 64), the smaller the amount of damage to which the adhesive is subjected. On the other hand, as shown in FIG. 4A, the longer the distance d between the end face 64 in the area A1 and the center C1 of the through-hole 15, the larger the conductance of the transfer gas becomes. Further, if the distance d is smaller than the diameter (D2) of the through-hole 15, the conductance rapidly deteriorates (becomes small). Accordingly, it is favorable that the distance d is not less than the minimum value, 0.1 mm, of the diameter (D2) of the through-hole 15.

Further, if the distance between the plasma and the adhesive (the distance between the center C1 of the through-hole 15 and the end face 64) is long, due to a difference between the thermal conductivity of the adhesive and the thermal conductivity of a space (air), a temperature difference sometimes occurs between the position on the object W just above the through-hole 15 and the periphery thereof.

As shown in FIG. 4B, in a high-power condition (a heat input condition of 5000 W to the surface of the electrostatic chuck 110), when the distance d between the end face 64 in the area A1 and the center C1 of the through-hole 15 is 1.85 mm, the temperature difference becomes 5° C. Further, when the distance d between the end face 64 in the area A1 and the center C1 of the through-hole 15 is 4.0 mm, the temperature difference becomes 20° C.

Further, in a low-power condition (a heat input condition of 3000 W to the surface of the electrostatic chuck 110), when the distance d between the end face 64 in the area A1 and the center C1 of the through-hole 15 is 1.85 mm, the temperature difference becomes 3.3° C. When the distance d between the end face 64 in the area A1 and the center C1 of the through-hole 15 is 5.0 mm, the temperature difference becomes 20° C.

In a plasma process, an in-plane temperature difference is one of the important items. According to the knowledge that the inventor(s) has obtained, it is favorable that the temperature difference is suppressed to 20° C. or less. For this reason, it is favorable that the distance d is 5.0 mm or less.

Therefore, it is favorable that the distance d between the end face 64 in the area A1 and the center C1 of the through-hole 15 is 0.1 mm or more and 5.0 mm or less. It is favorable that the distance d between the end face 64 in the area A1 and the center C1 of the through-hole 15 is 0.2 mm or more and 4.5 mm or less. It is more favorable that the distance d between the end face 64 in the area A1 and the center C1 of the through-hole 15 is 0.4 mm or more and 4 mm or less. It is further favorable that the distance d between the end face 64 in the area A1 and the center C1 of the through-hole 15 is 0.6 mm or more and 3.7 mm or less.

According to this, it is possible to attain both a reduction in the amount of damage to which the adhesive is subjected and uniform temperature distribution of the object W.

A material of the end portion 63 may be the same as a material of the bonding portion 61 or may also be different from a material of the bonding portion 61.

In a case where the material of the end portion 63 is the same as the material of the bonding portion 61, it is possible to further enhance an adhesive force between the bonding portion and the end portion.

In a case where the material of the end portion 63 is different from the material of the bonding portion 61, the end portion 63 is made so as not to contain fillers improving thermal conductivity, and thus it is possible to reduce occurrence of particles. Further, in a case where the material of the end portion 63 is different from the material of the bonding portion 61 and a silicone adhesive is used as the bonding portion 61, a material having more excellent plasma resistance than the silicone adhesive can be used in the end portion 63.

As for the material having more excellent plasma resistance than the silicone adhesive, a fluorine-based material can be given as an example. A fluorocarbon-based elastomer having "—$CF_2$—" as a basic skeleton can be given as an example. Further, a fluorocarbon-based elastomer in which a basic structure of "—$CF_2$—$CF(CF_3)$—O—" is linked to a silicone chain can be given as an example. Further, a fluorosilicone rubber having "—$SiF_2$—O—" and "$Si(CH_3)_2$—O—" as a basic skeleton can be given as an example. In addition, polyimide, acrylic polymer material, epoxy-based polymer material, or the like can be given as an example.

In addition, even in a case where the material of the end portion 63 is the same as the material of the bonding portion 61, or even in a case where the material of the end portion 63 is different from the material of the bonding portion 61, a boundary line 66 is present between the end portion 63 and the bonding portion 61. Due to this, in relation to the bonding between the ceramic dielectric substrate 11 and the base plate 50, it is possible to determine whether or not the bonding layer 60 has the end portion 63 fabricated in advance.

The thermal conductivity of the adhesive which is used in the bonding portion 61 is, for example, 0.2 watts/meter·kelvin (W/m·K) or more. It is more favorable that the thermal conductivity of the adhesive which is used in the bonding portion 61 is 0.4 W/m·K or more. It is further favorable that the thermal conductivity of the adhesive which is used in the bonding portion 61 is 0.8 W/m·K. The thermal conductivity of the adhesive which is used in the bonding portion 61 is, for example, 4.0 W/m·K or less. It is more favorable that the thermal conductivity of the adhesive which is used in the bonding portion 61 is 3.0 W/m·K or less. The dielectric breakdown strength of the adhesive which is used in the bonding portion 61 is, for example, 1 kilovolt/millimeter (kV/mm) or more. It is more favorable that the dielectric breakdown strength of the adhesive which is used in the bonding portion 61 is 2 kV/mm or more. It is further favorable that the dielectric breakdown strength of the adhesive which is used in the bonding portion 61 is 5 kV/mm or more. The dielectric breakdown strength of the adhesive which is used in the bonding portion 61 is, for example, 50 kV/mm or less. A heat resistance temperature of the adhesive which is used in the bonding portion 61 is 60° C. or more.

According to this, it is possible to use an adhesive which can maintain insulation while maintaining good heat transfer even if the electrostatic chuck 110 is used in a high-temperature process. Further, it is possible to have elasticity capable of alleviating a difference between the thermal expansion of the ceramic dielectric substrate 11 and the thermal expansion of the base plate 50. As a result, the life of the electrostatic chuck 110 is lengthened.

As shown in FIG. 2A, the distance d between the end face 64 in the area A1 and the center C1 of the through-hole 15 is larger than a radius ((D4)/2) of an opening 15e on the first major surface 11a side. Due to this, regardless of the durability of the adhesive, it is possible to reduce damage to which the bonding layer 60 is subjected. Even if the bonding layer 60 is damaged, it is possible to reduce the scattering of particles.

As shown in FIGS. 2A and 2B, the end portion 63 comes into contact with the second major surface 11b of the ceramic dielectric substrate 11 in a plane 63b rather than a point and comes into contact with the surface 57 of the base plate 50 in a plane 63c rather than a point. In the schematic cross-sectional view shown in FIG. 2A, a length (the length in the X-direction of the plane 63b) D5 of a portion in which the end portion 63 comes into contact with the second major surface 11b of the ceramic dielectric substrate 11 is longer than the thickness t1 of the bonding layer 60. In the schematic cross-sectional view shown in FIG. 2A, a length (the length in the X-direction of the plane 63c) D6 of a portion in which the end portion 63 comes into contact with the surface 57 of the base plate 50 is longer than the thickness t1 of the bonding layer 60. Each of the length D5 and the length D6 is, for example, about 500 μm or more.

According to this, since the end portion 63 is in contact with each of the second major surface 11b and the surface 57 in a plane rather than a point, it is possible to prevent occurrence of a space in the bonding layer 60. That is, an outer peripheral portion which is an outer peripheral portion of the end portion 63 and is on the side opposite to the space 65 when viewed from the end portion 63 is filled with a resin material.

As described above, the end portion 63 is crushed in the Z-direction in the process of fitting the ceramic dielectric substrate 11 and the base plate 50 to each other. The plane 63b in which the end portion 63 is crushed by the ceramic dielectric substrate 11 is on the same plane as a bonded surface (the second major surface 11b) of the ceramic dielectric substrate 11. The plane 63c in which the end portion 63 is crushed by the base plate 50 is on the same plane as a bonded surface (the surface 57) of the base plate 50.

Figure 5:
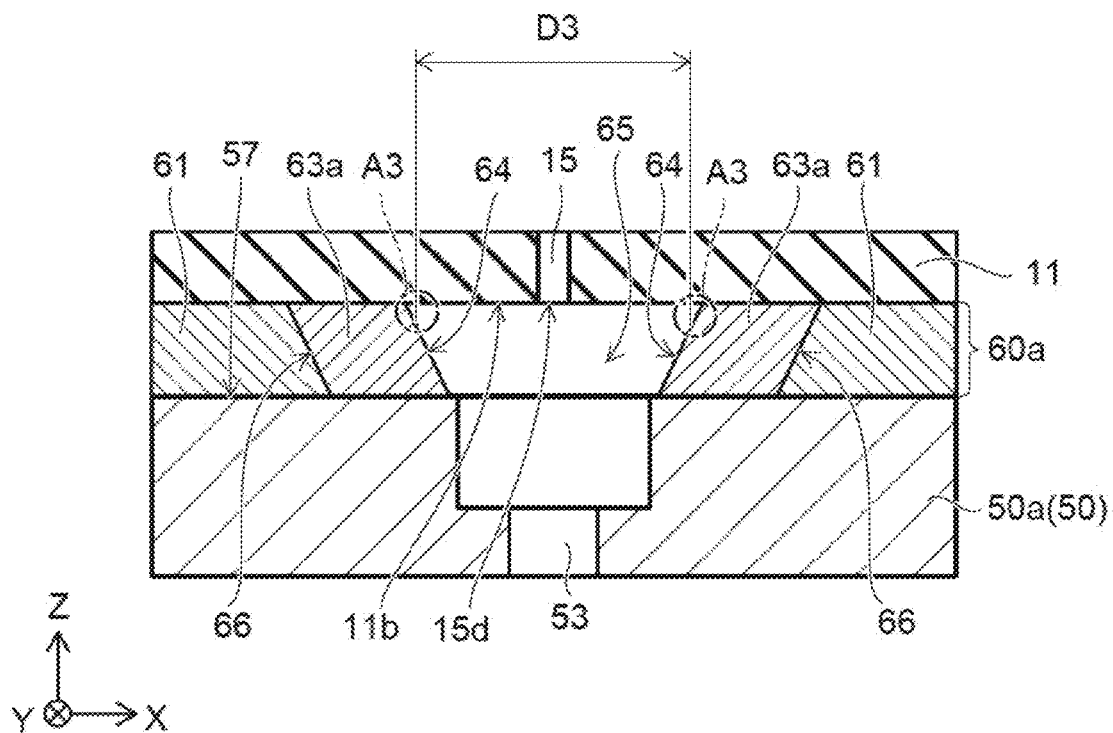
FIG. 5 is a schematic enlarged view showing the vicinity of another bonding layer of the embodiment.

FIG. 5 is a schematic enlarged view showing the vicinity of another bonding layer of the embodiment.

FIG. 5 is a schematic enlarged view of a portion equivalent to the portion A shown in FIG. 1.

A bonding layer 60a shown in FIG. 5 has the bonding portion 61 and an end portion 63a. The end portion 63a has, for example, a ring-like shape. The end face 64 of the bonding layer 60a on the space 65 side intersects with or comes into contact with the second major surface 11b of the ceramic dielectric substrate 11. An area A3 (the first area) in which the end face 64 intersects with the second major surface 11b is away from or is recessed from the opening 15d of the through-hole 15, compared to another area (the second area) of the end face 64 which is different from the area A3.

In the bonding layer 60a shown in FIG. 5, a distance D3 between the end portions 63 (or the end faces 64) facing each other becomes shorter with distance from the second major surface 11b in the normal direction. That is, the end face 64 has an inclination by which the distance D3 between the end portions 63 (or the end faces 64) facing each other becomes shorter with distance from the second major surface 11b in the normal direction. In addition, other structures or a material of each member is as described above with respect to FIGS. 1 to 3.

According to the example shown in FIG. 5, regardless of the durability of the adhesive, it is possible to reduce damage to which the bonding layer 60a is subjected. Even if the bonding layer 60a is damaged, it is possible to reduce the scattering of particles.

Figure 6:
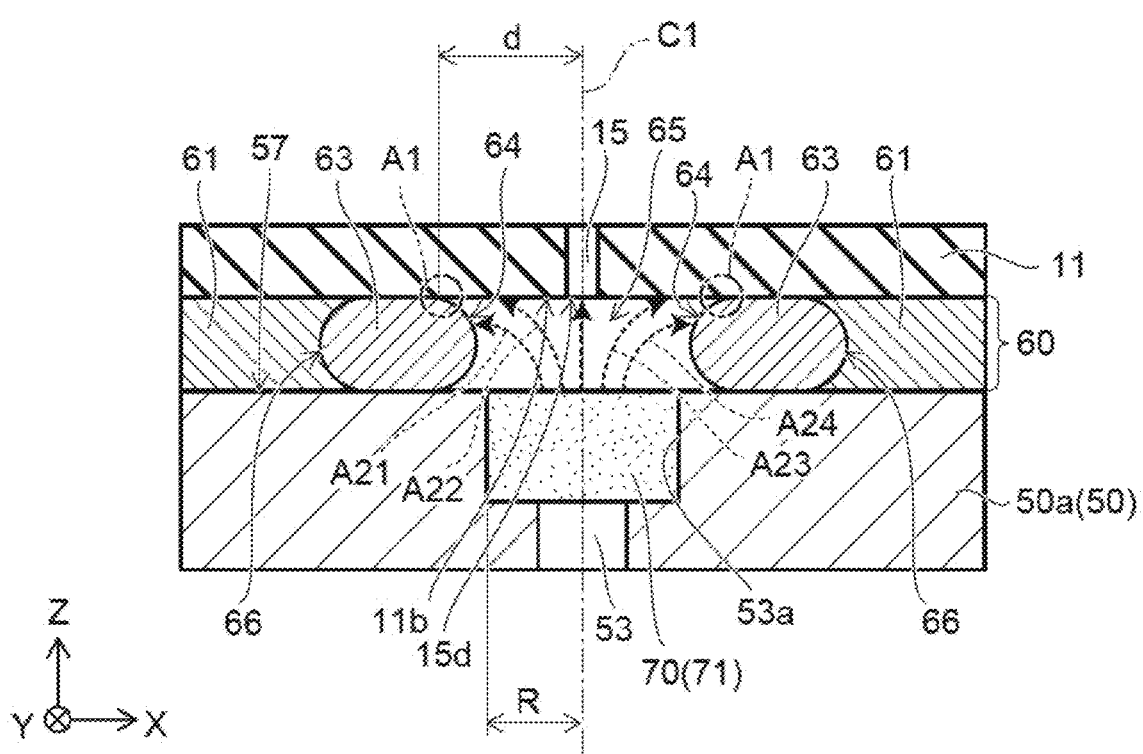
FIG. 6 is a schematic enlarged view showing the vicinity of still another bonding layer of the embodiment.

FIG. 6 is a schematic enlarged view showing the vicinity of still another bonding layer of the embodiment.

The electrostatic chuck 110 according to the embodiment may be provided with the insulator plug 70.

The insulator plug 70 may be provided in the gas introduction path 53 provided in the base plate 50. The insulator plug 70 is fitted into the ceramic dielectric substrate 11 side of the gas introduction path 53. As shown in FIG. 6, for example, on the ceramic dielectric substrate 11 side of the gas introduction path 53, a counterbore portion 53a is provided. The counterbore portion 53a is provided in a tubular shape. Due to appropriately designing the inner diameter of the counterbore portion 53a, the insulator plug 70 may be fitted into the counterbore portion 53a.

The insulator plug 70 has a ceramic porous body 71. The ceramic porous body 71 is provided in a tubular shape (for example, a cylindrical shape) and fitted to the counterbore portion 53a. The shape of the insulator plug 70 is preferably a cylindrical shape. However it is not limited to a cylindrical shape. For the ceramic porous body 71, a material having insulation properties is used. As a material of the ceramic porous body 71, for example, $Al_2O_3$, $Y_2O_3$, $ZrO_2$, MgO, SiC, AlN, $Si_3N_4$, or glass such as $SiO_2$ is acceptable.

Alternatively, the material of the ceramic porous body 71 may be $Al_2O_3$—$TiO_2$, $Al_2O_3$—MgO, $Al_2O_3$—$SiO_2$, $Al_6O_{13}Si_2$, YAG, $ZrSiO_4$, or the like.

The porosity of the ceramic porous body 71 is, for example, 30 percent (%) or more and 60% or less. The density of the ceramic porous body 71 is, for example, 1.5 grams/cubic centimeter (g/cm$^3$) or more and 3.0 g/cm$^3$ or less. Due to such porosity, the transfer gas such as He flowing through the gas introduction path 53 passes through a large number of pores of the ceramic porous body 71 and is sent from the through-hole 15 provided in the ceramic dielectric substrate 11 to the groove 14.

As shown in FIG. 6, with respect to the distance d between the end face 64 in the area A1 and the center C1 of the through-hole 15 and a radius R of the ceramic porous body 71, the following expression is established.

$$d > R \qquad \text{Expression (2)}$$

In addition, other structures or a material of each member is as described above with respect to FIGS. 1 to 3.

Due to this, like an arrow A21, an arrow A22, an arrow A23, and an arrow A24 shown in FIG. 6, the convection of the transfer gas can be created in the space 65 such that particles are easily deposited in a pocket formed in the area A1. That is, the convection of the transfer gas which selectively deposits particles in the pocket formed in the area A1 can be controlled in the space 65. For this reason, even if particles are generated, it is possible to reduce the scattering of the particles. Further, the ceramic porous body 71 is provided, whereby it is possible to have high voltage resistance in the through-hole 15 and the gas introduction path 53.

Figure 7:
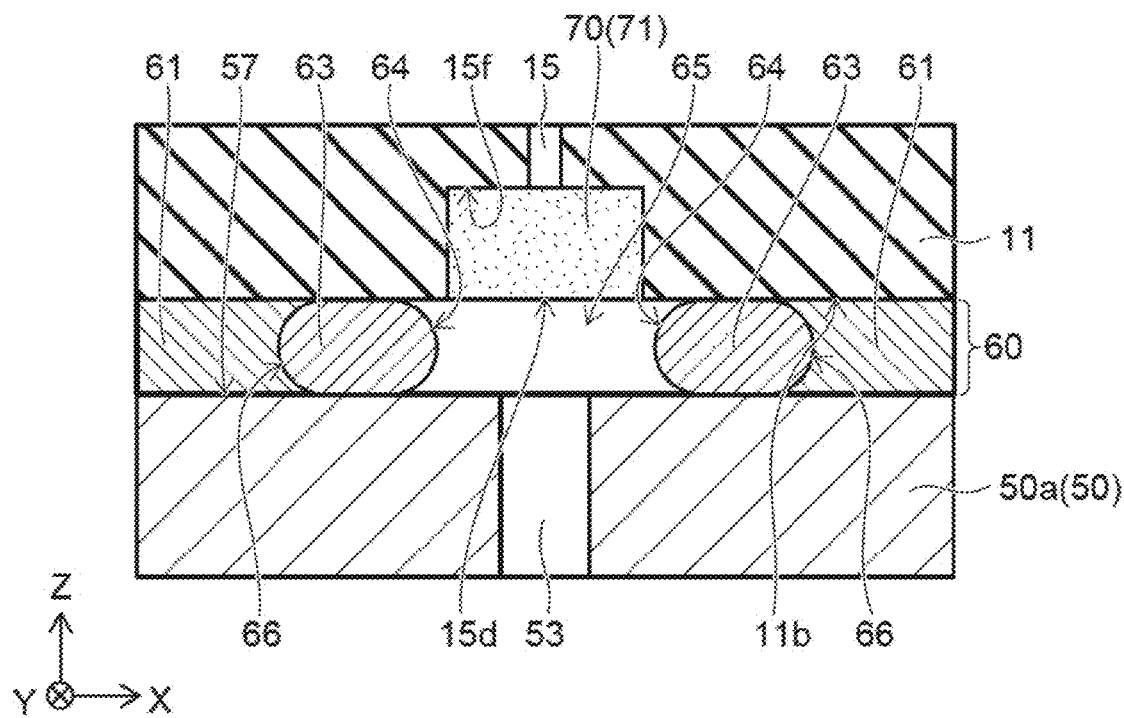
FIG. 7 is a schematic enlarged view showing the vicinity of still another bonding layer of the embodiment.

FIG. 7 is a schematic enlarged view showing the vicinity of still another bonding layer of the embodiment.

The electrostatic chuck 110 shown in FIG. 7 is provided with the insulator plug 70, similar to the electrostatic chuck 110 described above with respect to FIG. 6. The insulator plug 70 is provided in the through-hole 15 provided in the ceramic dielectric substrate 11. The insulator plug 70 is fitted into the base plate 50 side of the through-hole 15. As shown in FIG. 7, for example, the through-hole 15 has a counterbore portion 15f on the base plate 50 side. The counterbore portion 15f forms the opening 15d of the through-hole 15. The counterbore portion 15f is provided in a tubular shape. Due to appropriately designing the inner diameter of the counterbore portion 15f, the insulator plug 70 may be fitted into the counterbore portion 15f.

The insulator plug 70 is as described above with respect to FIG. 6. That is, the insulator plug 70 has the ceramic porous body 71. The transfer gas such as helium passes through the gas introduction path 53 and the space 65 and passes through the through-hole 15 via the insulator plug 70, thereby flowing into the space provided between the object W and the groove 14. In this manner, in the specification, in the range of the "through-hole", a hole in which a thing having a pathway through which gas flows, like, for example, a porous body or the like, is provided in the middle and through which arbitrary gas or fluid penetrates is included.

Figure 8:
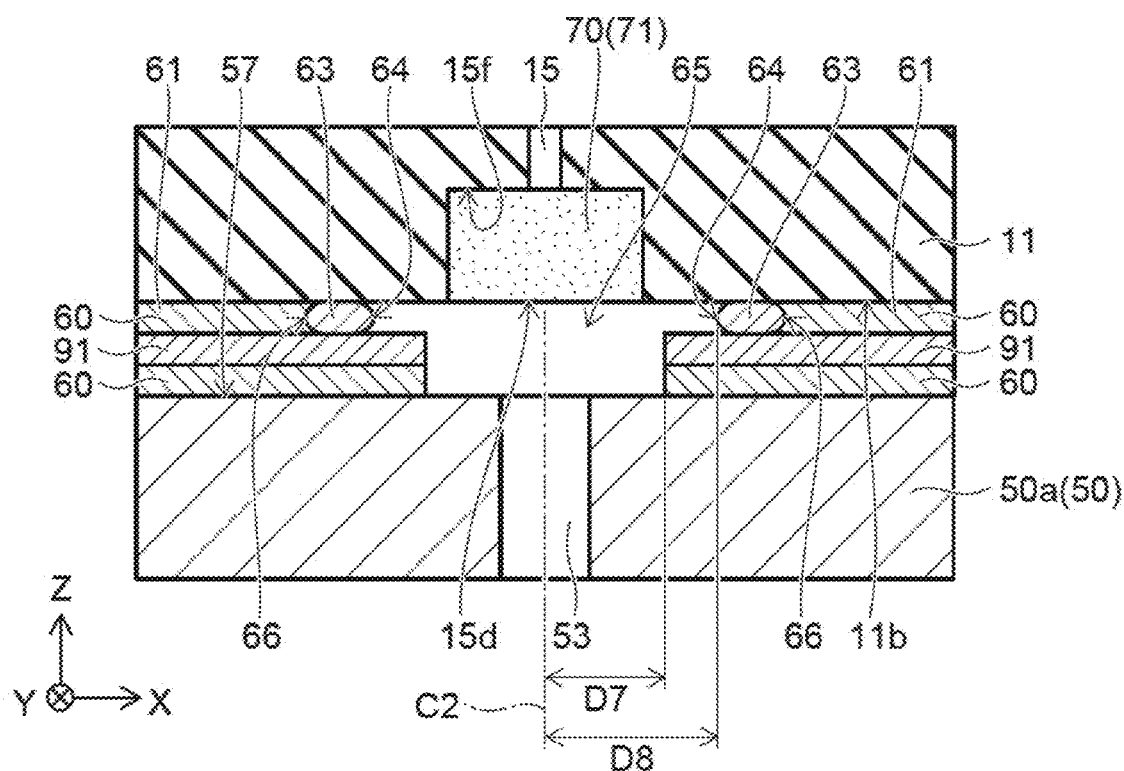
FIG. 8 is a schematic enlarged view showing the vicinity of still another bonding layer of the embodiment.

FIG. 8 is a schematic enlarged view showing the vicinity of still another bonding layer of the embodiment.

The electrostatic chuck 110 shown in FIG. 8 is further provided with a heater 91, compared to the electrostatic chuck 110 described above with respect to FIG. 7. The heater 91 is provided between the base plate 50 and the ceramic dielectric substrate 11. The heater 91 is supplied with voltage, and thus an electric current flows therethrough, whereby the heater 91 generates heat, thereby raising or maintaining the temperature of the object W.

The heater 91 is fixed to the second major surface 11b of the ceramic dielectric substrate 11 via the bonding layer 60. Further, the heater 91 is fixed to the surface 57 of the base plate 50 via the bonding layer 60. That is, the bonding layer 60 is provided between the heater 91 and the ceramic dielectric substrate 11 and between the heater 91 and the base plate 50. The bonding layer 60 provided between the ceramic dielectric substrate 11 and the heater 91 has the end portion 63. The end portion 63 is as described above with respect to FIGS. 1 to 4B. The bonding layer 60 provided between the base plate 50 and the heater 91 may have the end portion 63 or may not have the end portion 63.

As shown in FIG. 8, the heater 91 is provided away from the gas introduction path 53. The bonding layer 60 provided between the base plate 50 and the heater 91 is provided away from the gas introduction path 53. The end portion 63 of the bonding layer 60 provided between the ceramic dielectric substrate 11 and the heater 91 is provided on the side opposite to the gas introduction path 53 when viewed from an end portion of the heater 91. That is, a shortest distance D8 between the bonding layer 60 provided between the ceramic dielectric substrate 11 and the heater 91 and a center C2 of the gas introduction path 53 is longer than a shortest distance D7 between the heater 91 and the center C2 of the gas introduction path 53. As described above with respect to FIG. 2A, the space 65 having a cross-sectional shape which is longer in the horizontal direction than the vertical direction is connected to the through-hole 15 having a cross-sectional shape which is longer in the vertical direction than the horizontal direction.

Figure 9:
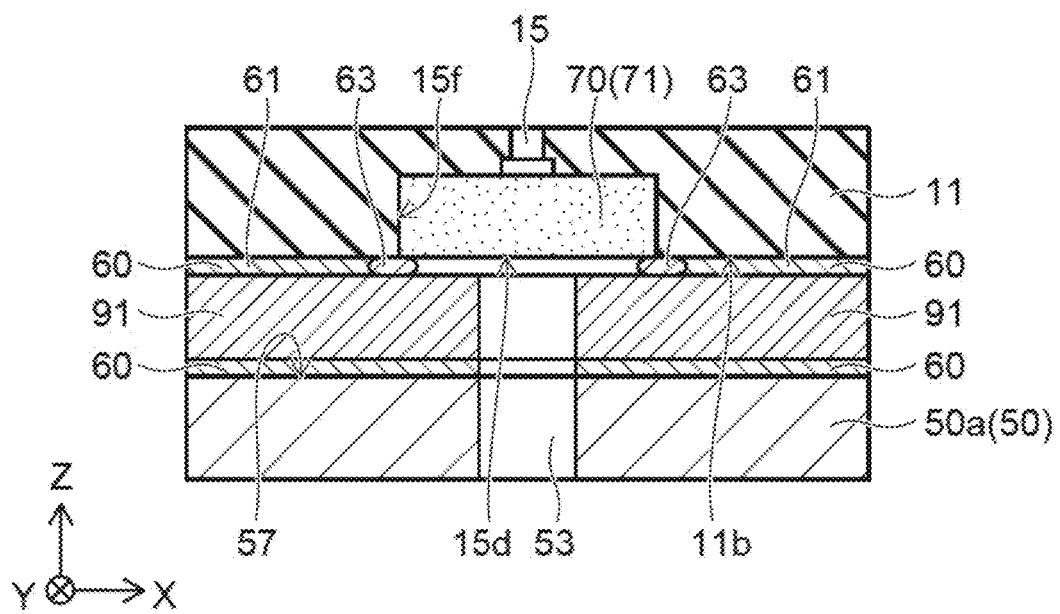
FIG. 9 is a schematic enlarged view showing the vicinity of still another bonding layer of the embodiment.

FIG. 9 is a schematic enlarged view showing the vicinity of still another bonding layer of the embodiment.

The electrostatic chuck 110 shown in FIG. 9 is provided with the heater 91, similar to the electrostatic chuck 110 described above with respect to FIG. 8. The bonding layer 60 provided between the ceramic dielectric substrate 11 and the heater 91 has the end portion 63. The end portion 63 is as described above with respect to FIGS. 1 to 4B. The bonding layer 60 provided between the base plate 50 and the heater 91 may have the end portion 63 or may not have the end portion 63.

As shown in FIG. 9, the end portion of the heater 91 is provided on approximately the same plane as the inner surface of the gas introduction path 53. An end portion of the bonding layer 60 provided between the base plate 50 and the heater 91 is provided on approximately the same plane as the inner surface of the gas introduction path 53.

According to the electrostatic chucks 110 shown in FIGS. 7 to 9, regardless of the durability of the adhesive, it is possible to reduce damage to which the bonding layer 60 is subjected. Even if the bonding layer 60 is damaged, it is possible to reduce the scattering of particles. Further, the ceramic porous body 71 is provided, whereby it is possible to have high voltage resistance in the through-hole 15 and the gas introduction path 53.

Figure 10:
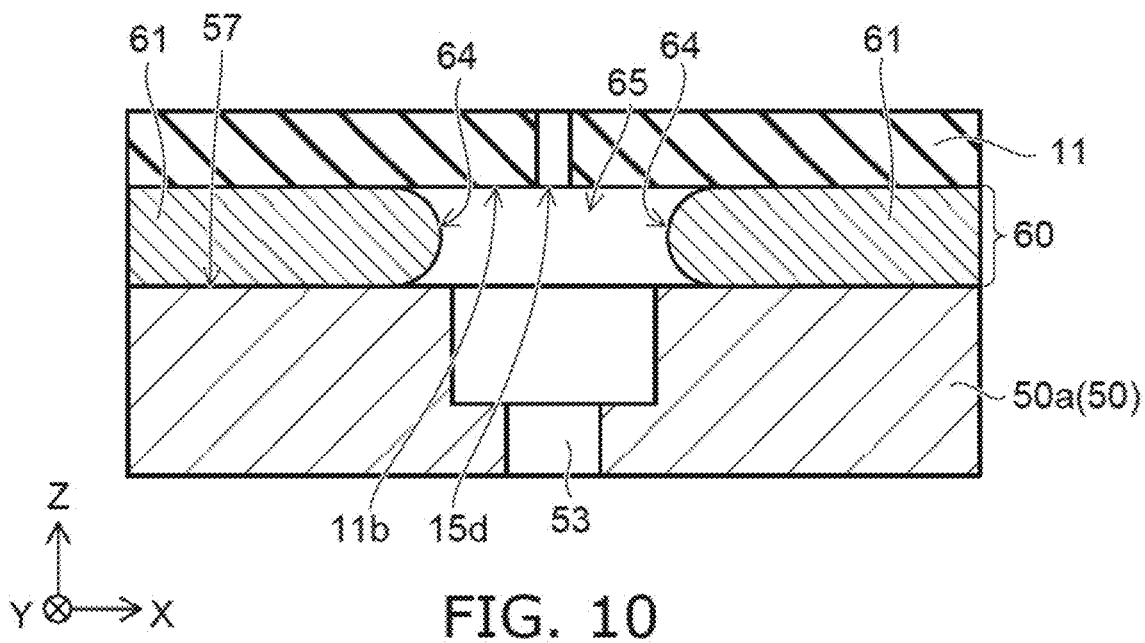
FIG. 10 is a schematic enlarged view showing the vicinity of still another bonding layer of the embodiment.

FIG. 10 is a schematic enlarged view showing the vicinity of still another bonding layer of the embodiment.

Figure 11:
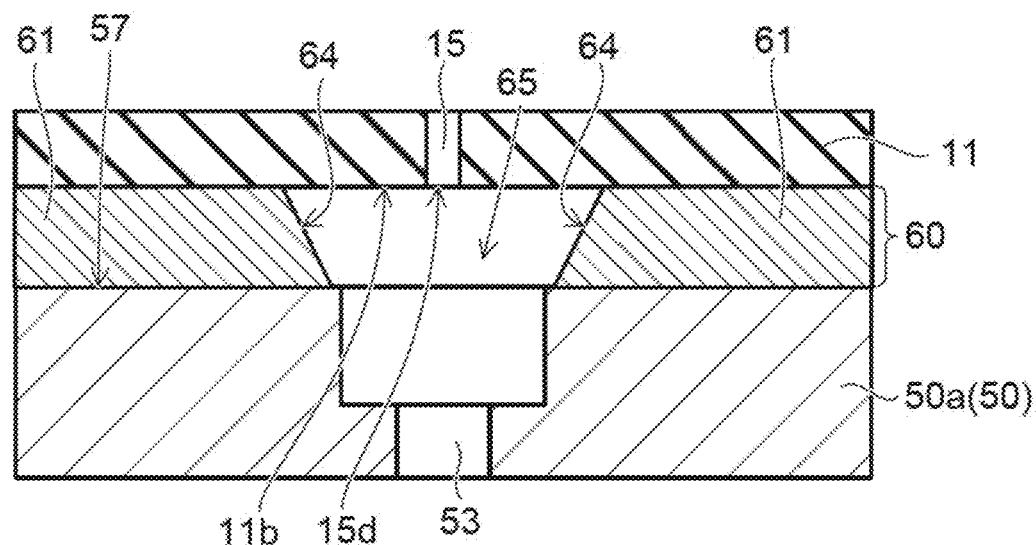
FIG. 11 is a schematic enlarged view showing the vicinity of still another bonding layer of the embodiment.

FIG. 11 is a schematic enlarged view showing the vicinity of still another bonding layer of the embodiment.

In the electrostatic chucks 110 shown in FIGS. 10 and 11, the bonding layer 60 is provided as a sheet. That is, the bonding layer 60 exhibits a sheet shape. For this reason, the bonding layer 60 does not have, for example, the ring-like end portion 63 as described above with respect to FIGS. 1 to 9. The sheet shape exhibits a state where the bonding portion 61 bonding the second major surface 11b and the base plate 50 together and the end portion 63 forming the space 65 are integrated with each other with the same material.

The end face 64 of the bonding layer 60 shown in FIG. 10 has the same shape as the shape of the end face 64 of the bonding layer 60 described above with respect to FIGS. 2A and 2B.

The end face 64 of the bonding layer 60 shown in FIG. 11 has the same shape as the shape of the end face 64 of the bonding layer 60 described above with respect to FIG. 5.

According to the electrostatic chucks 110 shown in FIGS. 10 and 11, even in a case where the bonding layer 60 is provided as a sheet, regardless of the durability of the adhesive, it is possible to reduce damage to which the bonding layer 60 is subjected. Even if the bonding layer 60 is damaged, it is possible to reduce the scattering of particles.

Next, a simulation of the end portion 63 of the bonding layer 60 carried out by the inventor(s) will be described with reference to the drawings.

Figure 12:
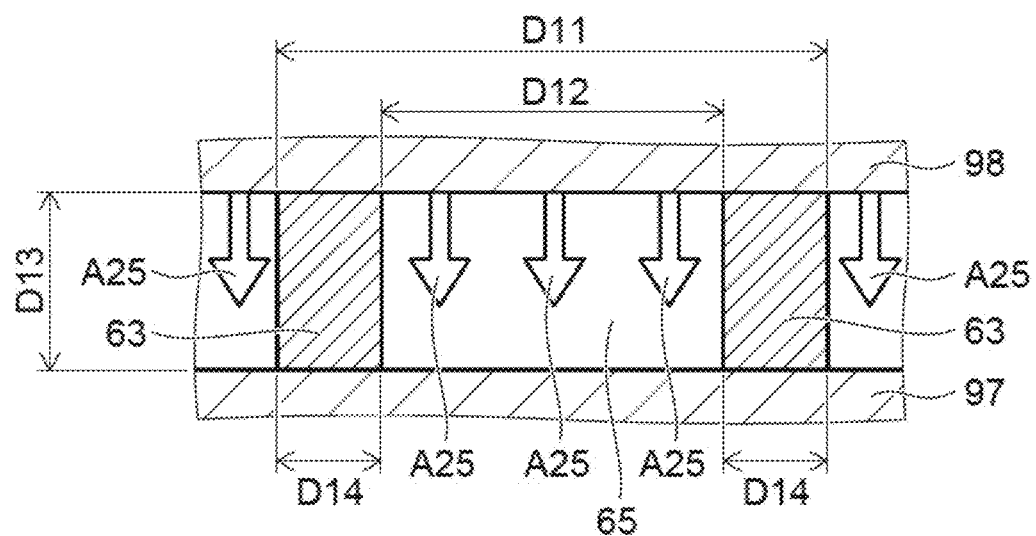
FIG. 12 is a schematic cross-sectional view showing the conditions of the simulation.

FIG. 12 is a schematic cross-sectional view showing the conditions of the simulation.

Figure 13A:
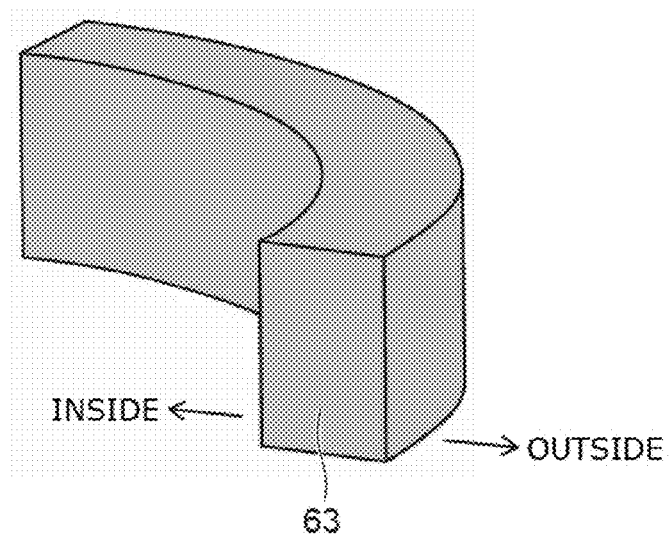
FIGS. 13A to 13C are schematic perspective views illustrating an example of the results of the simulation.
Figure 13B:
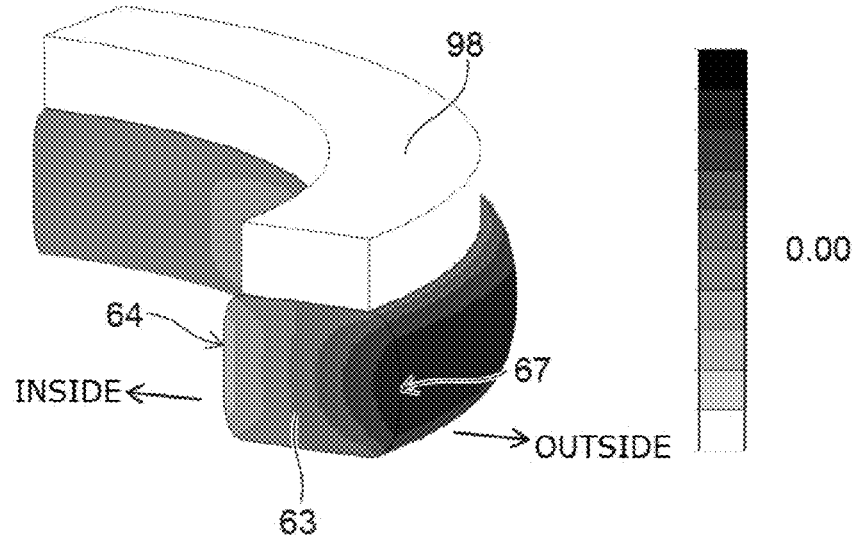
Figure 13C:
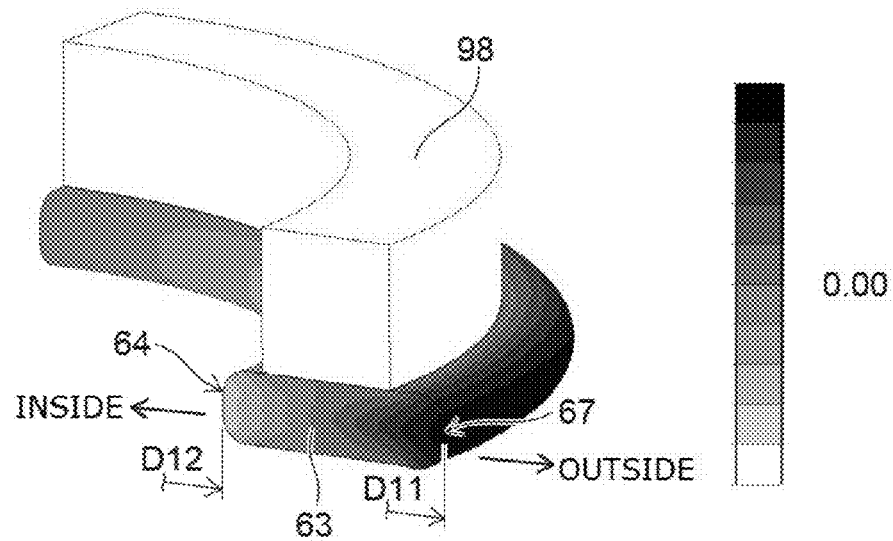

FIGS. 13A to 13C are schematic perspective views illustrating an example of the results of the simulation.

Figure 14A:
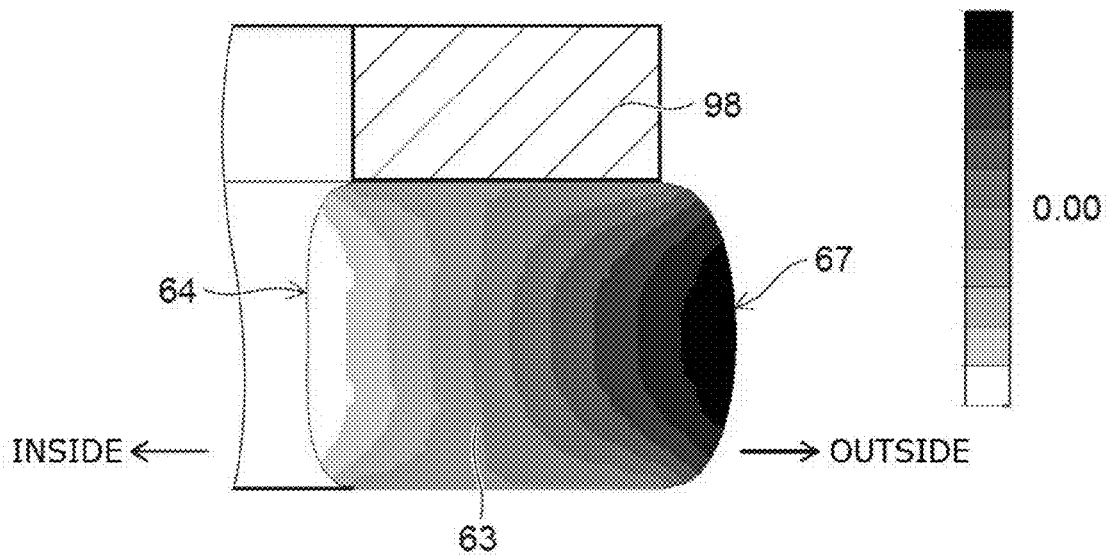
FIGS. 14A and 14B are schematic perspective views illustrating an example of the results of the simulation.
Figure 14B:
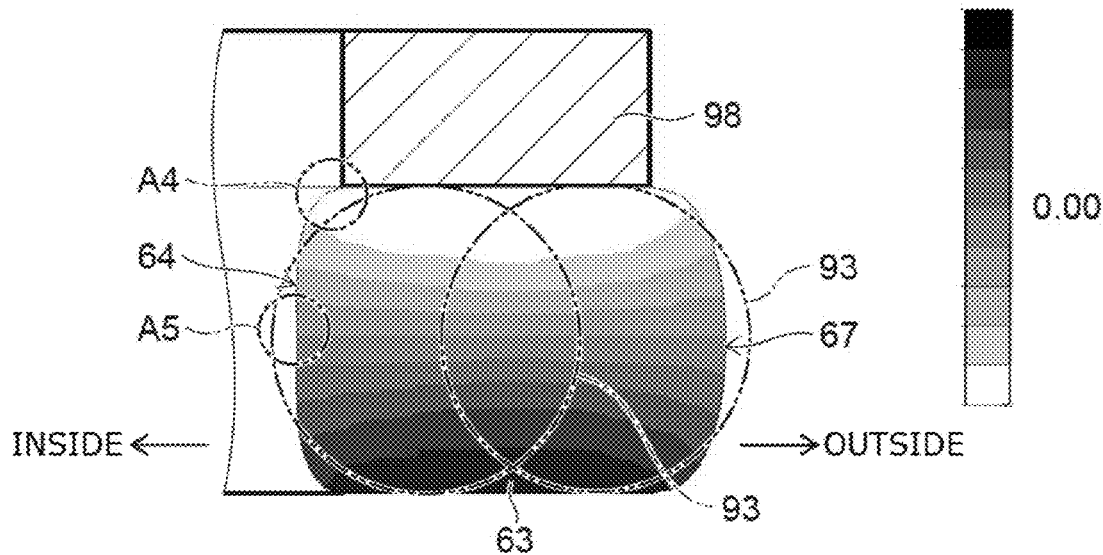

FIGS. 14A and 14B are schematic perspective views illustrating an example of the results of the simulation.

FIG. 13A is a schematic view showing the cross-sectional shape of the end portion 63 of the bonding layer 60 before it is compressed in a bonding process. FIGS. 13B, 13C, 14A and 14B are schematic views showing the cross-sectional shape of the end portion 63 of the bonding layer 60 after it is compressed in the bonding process.

As shown in FIG. 12, in the simulation, the end portion 63 is sandwiched between a first fixing portion 97 and a second fixing portion 98. The first fixing portion 97 is equivalent to, for example, the base plate 50. The second fixing portion 98 is equivalent to, for example, the ceramic dielectric substrate 11.

As the end portion 63 of the bonding layer 60, a model having a ring-like shape was made. An outer diameter D11 of the end portion 63 before compression is 3 mm or more and 10 mm or less. An inner diameter D12 of the end portion 63 before compression is 1 mm or more and 5 mm or less. In the simulation, the Young's modulus of a material of the end portion 63 was set to be 0.1 megapascals (MPa) or more and 20 MPa or less. Further, the Poisson's ratio of the material of the end portion 63 was set to be 0.3 or more and 0.5 or less.

In the simulation, compressive stress was applied to the end portion 63 by moving the second fixing portion 98 toward the first fixing portion 97, like an arrow A25 shown in FIG. 12. The results of the simulation are as shown in FIGS. 13A to 14B.

That is, FIG. 13B shows the displacement in a radial direction of the end portion 63 when a thickness D13 of the end portion 63 is thicker than the thickness t1 of the bonding layer 60 after bonding. FIG. 13C shows the displacement in the radial direction of the end portion 63 when the end portion 63 has been compressed to the thickness t1 of the bonding layer 60 after bonding. FIG. 14A shows the displacement in the radial direction of the end portion 63 when the thickness D13 of the end portion 63 is thicker than the thickness t1 of the bonding layer 60 after bonding. FIG. 14B shows the displacement in a thickness direction (the Z-direction) of the end portion 63 when the end portion 63 has been compressed to the thickness t1 of the bonding layer 60 after bonding. In FIGS. 13A to 14B, the magnitude of the displacement is shown by a color of shading.

As shown in FIG. 14B, a circle 93 having a diameter of the same length as the thickness D13 of the end portion 63 after compression is considered. In this case, the curvature of the end face 64 in an area A4 (the first area) in which the end face 64 of the end portion 63 intersects with the second fixing portion 98 is larger than the curvature of the circle 93. On the other hand, the curvature of the end face 64 in another area A5 (the second area) of the end face 64 which is different from the area A4 is smaller than the curvature of the circle 93. That is, the curvature of the end face 64 in the area A4 (the first area) in which the end face 64 of the end portion 63 intersects with the second fixing portion 98 is larger than the curvature of the end face 64 in another area A5 (the second area) of the end face 64 which is different from the area A4.

The area A4 is equivalent to the area A1 described above with respect to FIG. 2A. The other area A5 of the end face 64 which is different from the area A4 is equivalent to another area of the end face 64 which is the area described above with respect to FIG. 2A and is different from the area A1, and is, for example, an intermediate area between the first fixing portion 97 and the second fixing portion 98.

The curvature of an end face 67 on the outside of the end portion 63 is larger than the curvature of the end face 64 on the inside of the end portion 63. The visible outline of the end face 67 on the outside of the end portion 63 is equivalent to the boundary line 66 (refer to FIG. 2A) between the end portion 63 and the bonding portion 61.

The embodiments of the invention have been described above. However, the invention is not limited to the above description. Those skilled in the art can appropriately modify the above embodiments, and such modifications are also encompassed within the scope of the invention as long as they include the features of the invention. For instance, the shape, dimension, material, arrangement and the like of various components in the electrostatic chucks 110, and the installation configuration and the like of the bonding portion 61 and the end portion 63 are not limited to those illustrated, but can be modified appropriately. Furthermore, the configuration using Coulomb force is illustrated as the electrostatic chucks 110. However, the configuration using Johnson-Rahbek force may be applicable as the electrostatics 110.

Furthermore, various components in the above embodiments can be combined with each other as long as technically feasible. Such combinations are also encompassed within the scope of the invention as long as they include the features of the invention.

What is claimed is:

1. An electrostatic chuck comprising:
   a ceramic dielectric substrate having a first major surface on which an object to be adsorbed is placed, a second major surface on an opposite side to the first major surface, and a first through-hole provided over from the second major surface to the first major surface;
   a metallic base plate which supports the ceramic dielectric substrate and has a second through hole that communicates with the first through-hole; and
   a bonding layer which is provided between the ceramic dielectric substrate and the base plate and includes a resin material,
   the bonding layer having a space which is provided between an opening of the first through-hole in the second major surface and the a second through hole and is larger than the opening in a horizontal direction, and
   a first area in which an end face of the bonding layer on a side of the space intersects with the second major surface being recessed from the opening further than another second area of the end face which is different from the first area,
   the bonding layer having
      a bonding portion which bonds the second major surface and the base plate together, and
      an end portion which has the end face and forms the space, and a material of the bonding portion being different from a material of the end portion.

2. The chuck according to claim 1, wherein in the first area when viewed in a direction perpendicular to a normal to the second major surface, an angle between the second major surface and the end face becomes larger toward the second major surface.

3. The chuck according to claim 2, wherein a third area in which an angle between the second major surface and the end face becomes smaller with distance from the second major surface in a direction of the normal is provided.

4. The chuck according to claim 1, wherein a distance between the end faces facing each other becomes shorter with distance from the second major surface in a direction of the normal.

5. The chuck according to claim 1, wherein in a distance d between the end face in the first area and a center of the first through-hole and a distance D between the end faces facing each other in the second area, a relational expression of 2d≥D is established.

6. The chuck according to claim 5, wherein the distance d is 0.1 millimeters or more and 5.0 millimeters or less.

7. The chuck according to claim 5, further comprising:
   a porous body provided in the gas introduction path,
   wherein in the distance d and a radius R of the porous body, a relational expression of d>R is established.

8. The chuck according to claim 5, wherein the distance d is larger than a radius of an opening of the first through-hole on a side of the first major surface.

9. The chuck according to claim 1, wherein thermal conductivity of an adhesive which is used in the bonding portion is 0.1 watts/meter·kelvin or more,
   dielectric breakdown strength of an adhesive which is used in the bonding portion is 1 kilovolt/millimeter or more, and
   a heat resistance temperature of an adhesive which is used in the bonding portion is 40° C. or more.

10. The chuck according to claim 1, wherein a length in the horizontal direction of the space is longer than a thickness of the bonding layer.

11. The chuck according to claim 1, wherein the end portion comes into contact with each of the second major surface and the base plate in a plane, and
   a length in the horizontal direction of the plane in which the end portion comes into contact with each of the second major surface and the base plate is longer than a thickness of the bonding layer.

12. The chuck according to claim 11, wherein an outer peripheral portion of the end portion, the outer peripheral portion being on an opposite side to the space when viewed from the end portion, is filled with the resin material.

13. The chuck according to claim 11, wherein a plane in which the second major surface comes into contact with the end portion is on a same plane as a plane in which the second major surface is bonded by the bonding layer, and
   a plane in which the base plate comes into contact with the end portion is on a same plane as a plane in which the base plate is bonded by the bonding layer.

14. The chuck according to claim 11, wherein curvature of the end face in the first area is larger than curvature of the end face in the second area.

15. The chuck according to claim 1, wherein the ceramic dielectric substrate includes a Coulomb material having volume resistivity of $1 \times 10^{14}$ ohm·centimeter or more.

16. The chuck according to claim 1, wherein the material of the end portion does not contain thermal conductivity improving filler.

17. The chuck according to claim 1, wherein the material of the bonding portion is silicone adhesive and the material of the end portion has greater plasma resistance than that of the silicone adhesive of the bonding portion.

18. The chuck according to claim 17, wherein the material of the end portion is selected from the group consisting of a fluorine-based material, a fluorocarbon-based elastomer having "—$CF_2$—" as a basic skeleton, a fluorocarbon-based elastomer in which a basic structure of "—$CF_2$—$CF(CF_3)$—O—" is linked to a silicone chain, a fluorosilicone rubber having "—$SiF_2$—O—" and "$Si(CH_3)_2$—O—" as a basic skeleton, polyimide, acrylic polymer material, and epoxy-based polymer material.

19. The chuck according to claim 1, wherein the material of the end portion is selected from the group consisting of a fluorine-based material, a fluorocarbon-based elastomer having "—$CF_2$—" as a basic skeleton, a fluorocarbon-based elastomer in which a basic structure of "—$CF_2$—$CF(CF_3)$—O—" is linked to a silicone chain, a fluorosilicone rubber having "—$SiF_2$—O—" and "$Si(CH_3)_2$—O—" as a basic skeleton, polyimide, acrylic polymer material, and epoxy-based polymer material.

\* \* \* \* \*